United States Patent [19]

Bachman

[11] 4,056,817

[45] Nov. 1, 1977

[54] SYSTEM FOR MONITORING A PERIODIC FUNCTION

[75] Inventor: Wesley J. Bachman, Auburn, Ill.

[73] Assignee: Dickey-john Corporation, Auburn, Ill.

[21] Appl. No.: 744,174

[22] Filed: Nov. 22, 1976

[51] Int. Cl.² .............................................. G08B 21/00
[52] U.S. Cl. ............................ 340/253 Y; 340/213 R; 361/182
[58] Field of Search ......... 340/146 IE, 149 R, 171 R, 340/213 R, 248 A, 248 P, 253 R, 253 N, 253 Y; 317/147

[56] References Cited

U.S. PATENT DOCUMENTS

| 3,639,810 | 2/1972 | Schleif | 317/147 |
| 3,703,717 | 11/1972 | Kuster | 340/253 Y |

Primary Examiner—Alvin H. Waring
Attorney, Agent, or Firm—Olson, Trexler, Wolters, Bushnell & Fosse, Ltd.

[57] ABSTRACT

A system for monitoring the frequency of a periodic function and indicating whether or not said function frequency differs from a predetermined frequency, with the function frequency being represented by an electrical signal having a parameter which varies systematically in accordance with the period of the function. A ramp signal generator is provided for generating a control signal having a characteristic which starts at a reference level and attains a predetermined level after the passage of a preselected period of time. A first switch is coupled to the control signal generating means and has two switching states with the switch being normally biased to one of its switching states but responsive to the control signal characteristic attaining the predetermined level for switching to the other of its switching states. An indicator is coupled to the first switch for indicating which state the switch is in. A second switch is coupled to the control signal generating means and is responsive to the systematic variation of the parameter for periodically re-setting the characteristic of the control signal to said reference level, whereby the first switch is in one of its two switching states when the function period is less than the preselected period of time and is in the other switching state when the function period is greater than the preselected period of time, and the system thus indicates whether or not the function is occurring at the predetermined frequency.

13 Claims, 2 Drawing Figures

SYSTEM FOR MONITORING A PERIODIC FUNCTION

BACKGROUND OF THE INVENTION

This invention relates generally to a system for monitoring the frequency of a periodic function and indicating whether or not the function frequency differs from a given frequency and, more particularly, it relates to such a system for use in monitoring rotating shafts and the like in agricultural equipment.

In many types of machines, it is often necessary or desirable to monitor a condition or function and to provide for an indication or alarm whenever the frequency of the periodic function differs from a predetermined frequency. For example, in agricultural equipment such as combines, planters, or the like, it is important for the operator to know whenever the speed of a shaft is slower than its normal operating speed because such a slow-down often indicates that the machine is malfunctioning due to an overloaded auger, slipping belt, worn bearing, plugged straw walker chamber, or the like. Such malfunctions obviously can cause significant losses of time and money. Moreover, alerting the operator of the machine to a malfunction as soon as it occurs often enables the operator to correct the cause of the malfunction and thereby avoid the possibility of a much more serious malfunction such as the breakage of a part or burning out of a bearing, which would disable the machine for a relatively long period of time.

There are presently available on the market monitoring systems which very successfully perform such monitoring. One such monitoring system, for example, is disclosed in U.S. Pat. No. 3,739,367 to Fathauer, which is assigned to the assignee of the present invention. In certain monitoring applications, however, it would be desirable to have a system which is easily adaptable to simultaneously monitoring number of periodic functions and has a wide monitoring range at an economical cost.

It is therefore an object of the invention to provide a new, improved system for monitoring the frequency of a periodic function and indicating whether or not the frequency differs from a predetermined frequency.

It is a further object of the invention to provide such a system which monitors on a period-by-period basis.

It is another object of the invention to provide such a system which has a relatively wide monitoring range.

It is yet another object of the invention to provide such a system which is adaptable to simultaneously monitor a number of periodic functions.

SUMMARY OF THE INVENTION

In accordance with the invention, a new and improved system for monitoring the frequency of a periodic function and indicating whether or not said function frequency differs from a predetermined frequency with the function frequency being represented by an electrical signal having a parameter which varies systematically in accordance with the period of the function, comprises means for generating a control signal having a characteristic which starts at a reference level and attains a predetermined level after the passage of a preselected period of time. A first switching means is coupled to the control signal generating means and has two switching states, with the first switching means being normally biased to one of its switching states but responsive to the control signal characteristic attaining said predetermined level for switching to the other of its switching states. Indicating means are coupled to the first switching means for indicating which state the first switching means is in. Also provided are second switching means coupled to the control signal generating means and responsive to the systematic variation of the parameter for periodically re-setting the characteristic of the control signal to the reference level, whereby the first switching means is in one of its two switching states when the function period is less than the preselected period of time and is in the other switching state when the function period is greater than the preselected period of time, and the system thus indicates whether or not the function is occurring at the predetermined frequency.

The features of the present invention which are believed to be novel are set forth with particularity in the appended claims.

The organization and manner of operation of the invention, together with further objects and advantages thereof, may best be understood by reference to the following description taken in connection with the accompanying drawings, in the several figures of which like reference numerals identify like elements and in which:

FIG. 1 is an electrical schematic diagram of a preferred embodiment of the invention; and FIG. 2 is a graphical representation of some of the signals which occur in the embodiment of the invention illustrated in FIG. 1.

DESCRIPTION OF THE PREFERRED EMBODIMENT

Figure 1:
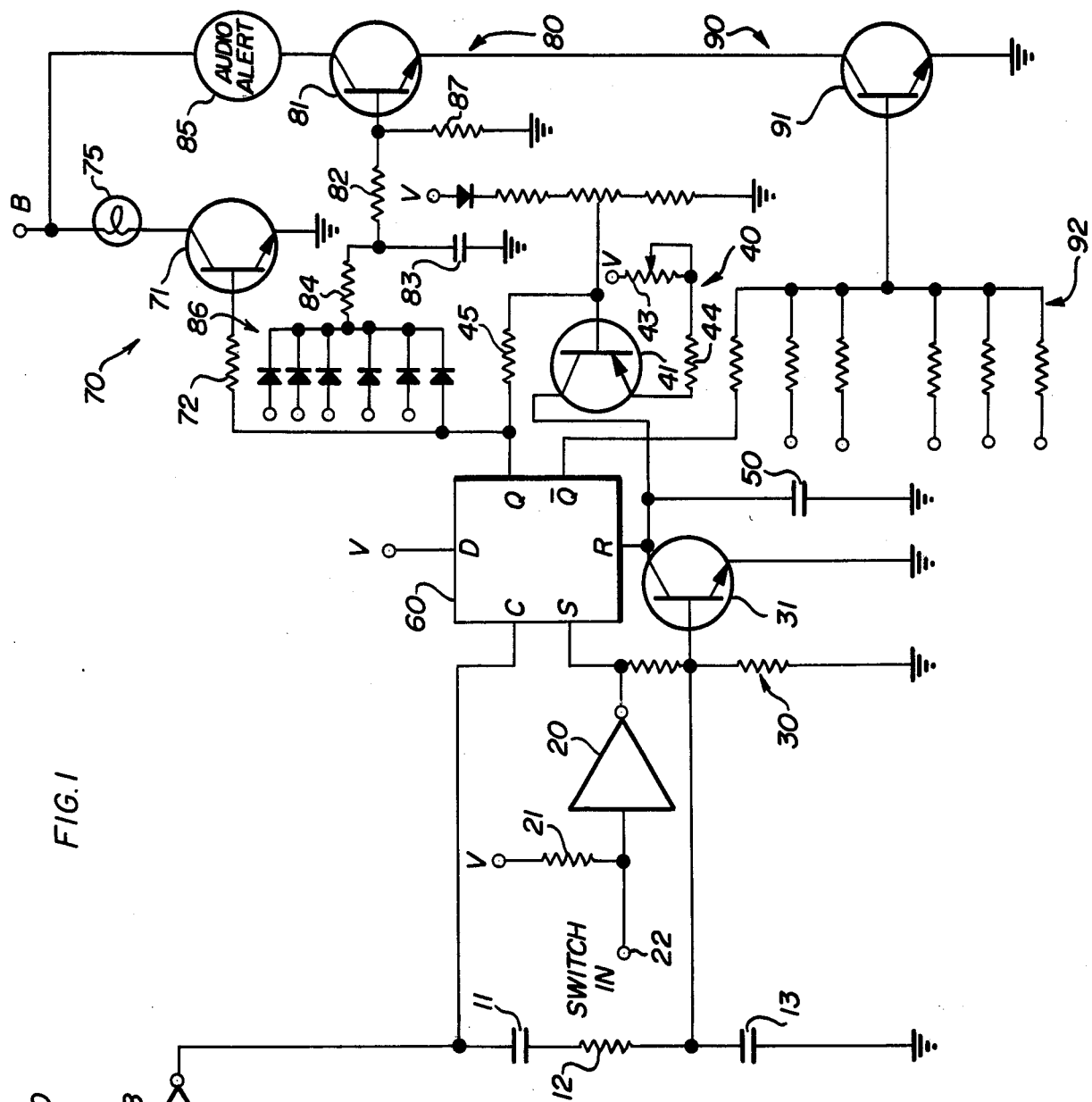

With reference to FIG. 1, there is shown an electrical schematic diagram of a preferred embodiment of a system for monitoring the frequency of a periodic function and indicating whether or not the frequency differs from a predetermined frequency. In general, the function frequency is represented by an electrical signal having a parameter which varies systematically in accordance with the period of the function; however, the particular manner in which this electrical frequency is obtained forms no part of the present invention and may, therefore, be obtained in any suitable conventional manner desired. For example, a sine wave input signal such as that represented by a curve A in FIG. 2 may be used to represent the function frequency, with the frequency of the sine wave signal being chosen as the parameter which varies systematically in accordance with the period of the function. For purposes of illustration, this function may be a shaft which revolves at a predetermined speed under normal operating conditions. One cycle of sine wave input signal A could, therefore, represent one revolution or period of the shaft. Input circuitry 10 filters and shapes the sine wave signal applied to terminal 1 to provide a square wave signal suitable for use in the illustrated embodiment of the invention.

Means for generating a control signal having a characteristic which starts at a reference level and attains a predetermined level after the passage of a preselected period of time are provided in the form of ramp signal generator including a current source 40 and a storage capacitor 50.

First switching means comprising a flip-flop circuit 60 is coupled to the control signal generating means at its reset terminal R and has two switching states, with flip-flop 60 normally being biased to its set switching state but responsive to the ramp signal attaining the predetermined level for switching to the other or reset switching state.

Indicating means including a lamp 75 are coupled to first switching means for indicating in which state flip-flop 60 is switched.

Second switching means 30 are coupled to the control signal generating means and are responsive to the systematic variation of the parameter for periodically resetting the level of the ramp signal to the reference level, whereby flip-flop 60 is in one of its set switching state when the function period is less than the preselected period of time and is in its reset switching state when the function period is greater than the preselected period of time, and the system thus indicates whether or not the function is occurring at the predetermined frequency.

Figure 2:
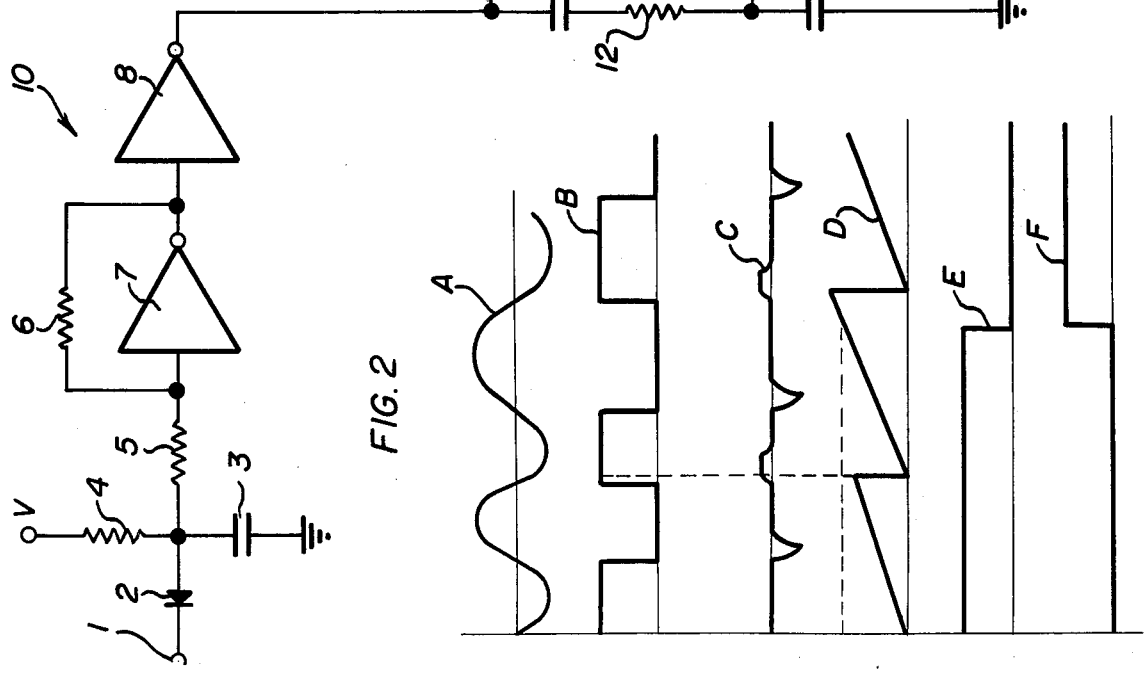

In operation, the output of input circuitry 10 is a square wave signal which, as mentioned hereinabove, is graphically represented by curve B of FIG. 2. Signal B is thus a pulse-train signal having a frequency which varies systematically in accordance with the period of the function being monitored; that is, its frequency is directly proportional to the number of cycles of the input sine wave signal. Thus, in the illustrated embodiment of the invention, each pulse of signal B represents one revolution of the shaft being monitored (not shown). The invention is, of course, not limited to such a one-to-one arrangement, and any systematic relationship between pulse-train signal B and the frequency of the function being monitored may of course be used without departing from the principles of the present invention. Pulse-train signal B clocks flip-flop 60 and drives a switching circuit 30 which is coupled in parallel with storage capacitor 50 to thereby periodically reset the ramp signal amplitude generated across storage capacitor 50 by shorting storage capacitor 50 in response to each pulse from invertor 8.

More specifically, the particular embodiment of the invention illustrated in FIG. 1 utilizes a diode 2 in conjunction with capacitor 3, resistors 4, 5 and 6 and a non-inverting buffer amplifier 7 serve to filter and shape the incoming periodic signal applied at input terminal 1. The invertor 8 serves principally to obtain the desired input sense; that is, it serves to convert the polarity of the output pulse signal from amplifier 7 in this embodiment to the polarity suitable for application to the remainder of the circuitry.

The square-wave output signal of invertor 8 is applied to the C terminal of flip-flop 60 to clock it; that is, to transfer a logical "1" or "high" to the Q output terminal. It should be noted, of course, that the lamp 75 and lamp driver circuitry 70 may be connected to either the Q or $\bar{Q}$ terminals of flip-flop 60 to allow the lamp sense to be reversed for either an over- or under-frequency application of the invention.

The set terminal S of flip-flop 60 is held low by means of the series combination of an inverting amplifier 20 and a resistor 21 connected between the set terminal of flip-flop 60 and the voltage source V. The set terminal is held low in this manner so long as no input signal is applied to the "switch in" input terminal 22, which terminal is provided to permit the system of the invention to monitor a static or steady-state function or condition. This biasing arrangement, with no input signal applied to terminal 22, is typically used for frequency monitoring applications of the invention and flip-flop 60 may be of any conventional construction such as one section of a "4013M, dual D flip-flop" integrated circuit manufactured by National Semiconductor. The clock input signal applied at terminal C of flip-flop 60 is simultaneously differentiated by capacitor 11, resistor 12, and switching transistor 31 along with the flip-flop toggle. The differentiated signal is graphically represented by curve C of FIG. 2. This arrangement causes storage capacitor 50 to be discharged via the collector-emitter path of switching transistor 31 to ground to thereby synchronize the generation of the ramp signal by ramp signal generator 40 to the input frequency, as graphically represented by reference to curve D of FIG. 2. Although the derivative appears at the junction of resistor 12 and capacitor 13 coincident with the clocking of flip-flop 60, capacitor 13 and resistor 12 serve to delay the switching of transistor 31 such that the storage capacitor 50 is discharged slightly after the flip-flop 60 has been toggled. The timing of these signals is illustrated in FIG. 2 with reference to signals B, C, and D. By providing such delay, the reset terminal of flip-flop 60 is given final control of the flip-flop output to thus insure that the lamp will not change states on a momentary basis.

Storage capacitor 50 and its associated current source circuit 40 form a ramp or sawtooth signal generator which, by means of a variable resistor 43 and fixed resistor 44 coupled in series between voltage source B and the emitter of a PNP transistor 41, enable the operator of the system to vary the rate at which the ramp signal is generated. By varying this rate, the time required for the amplitude of ramp signal to start at a reference level (e.g., zero volts) and attain the predetermined trigger voltage of reset terminal of flip-flop 60 may thus be preselected by the user. In this manner, the reset terminal R of flip-flop 60 is effectively utilized as a voltage comparator to detect the point at which the ramp signal amplitude exceeds a predetermined voltage level. With a fixed voltage and a constant sweep rate, a preselected time passes between the time when the lamp signal voltage is at its reference or zero level and when it attains the predetermined comparison level. Consequently, an input signal having a frequency high enough, for example, such that its period is shorter than that of the amount of time for the ramp signal to go from its reference or zero voltage to the predetermined voltage, will cause switching transistor 31 to discharge capacitor 50 before the ramp voltage attains the predetermined level and, thereby, prevent the flip-flop 60 from switching states or "toggling." Hence, flip-flop 60 maintains a logical "1" at its Q terminal and thus causes lamp 75 to remain energized. On the other hand, when the income frequency decreases such that its period becomes longer than the amount of time required for the ramp signal to attain the predetermined voltage, the ramp signal will thus reset flip-flop 60 and thereby toggle the flip-flop to create a logical "0" at the Q output and a logical "1" at the $\bar{Q}$ output. This is graphically shown by reference to curves E and F of FIG. 2. Thus, lamp 75 is extinguished, indicating that the frequency of the periodic function being monitored is slower than the predetermined frequency. Quite obviously, by changing the lamp sense or the interpretation of the lamp condition, the system can detect frequency increase or decrease about a given setpoint or predetermined voltage level. A resistor 45 is connected between the Q output of flip-flop 60 and the base of current source transistor 41 to provide a relatively small amount (approximately 1% of the setpoint) of positive feedback to insure that phase jitter on the incoming signal will not cause the flip-flop 60 to toggle on a cycle-to-cycle basis.

The audio alert or alarm circuit of the indicating means comprises two series-connected transistor switching circuits 80 and 90. Switching circuit 80 comprises a switching transistor 81 having its base connected to the anodes of a plurality of diodes 86 by means of two series-connected resistors 82 and 84. A capacitor 83, in conjunction with resistor 82 and a biasing resistor 87 coupled between the base of switching transistor 81 and ground, form a delay for the audio alarm. Each of the cathodes of diodes 86 may be connected to a separate input circuit such as the monitoring circuit shown in FIG. 1 or, in some cases, to a different type of signal input which monitors a steady-state condition (e.g., a signal which indicates that a container is either empty or full). During normal operation of at least one of the monitor circuits connected to the diodes 86, the capacitor 83 will remain charged and the base of transistor 81 will be biased so that the transistor is in a conducting state. Thus when transistor 91 is biased to a conducting state as described below, the audible alarm will sound. However, when all of the monitoring circuits sense a failure or deviation from the normal such as when a combine or planter slows down while turning around at the end of a field, there will be no enabling signal through any of the diodes 86. Thus, the capacitor 83 will start to discharge and after a predetermined time delay determined by capacitor 83, the transistor 81 will be switched off and the alarm will be turned off. In other words, after a brief interval, the audible alarm will be turned off whenever the machine being monitored is intentionally stopped or slowed so as to avoid annoying the operator. It is understood that although only six inputs are illustrated in the embodiment of the invention of FIG. 1, any desired number of inputs may be employed without departing from the principles of the present invention.

Switching circuit 90 comprises a switching transistor 91 which is actuated by signals applied to its base by means of a plurality of resistors 92. As with switching circuit 80, switching circuit 90 may be connected to any number of different monitoring signals provided by duplicate or even different monitor circuits associated with separate components or function of a machine being monitored. One of the input resistors 92 is used to connect the $\bar{Q}$ output of flip-flop 60 of each of the monitoring circuits to the base of switching transistor 91. As noted above, curve E of FIG. 2 illustrates the $\bar{Q}$ output of flip-flop 60 and curve F illustrates the Q output of flip-flop 60. Whenever any one of the machine functions being monitored fails or deviates substantially from the normal, transistor 91 is turned on so as to energize the alarm.

Thus, there has been shown and described a new and improved system for monitoring the frequency of a periodic function and indicating whether or not the frequency differs from a predetermined frequency. The system has the advantage of being able to detect a frequency change, higher or lower than the predetermined frequency, in the span of only a single period of cycle, to thereby minimize the delay between the onset of the cause of the slow-down or speed-up and the alerting of the operator to the malfunction. The system may be constructed with relatively few parts to, thereby, make construction of the monitoring system very attractive economically. Moreover, the system provides for a wide range (approximately 100 to 1) of user frequency selectability together with a substantially constant sensitivity.

While particular embodiments of the invention have been shown and described, it will be obvious to those skilled in the art that changes and modifications of the present invention, in its various aspects, may be made without departing from the invention in its broader aspects, some of which changes and modifications being of matter of routine engineering or design and others being apparent only after study. As such, the scope of the invention should not be limited by the particular embodiment and specific construction described herein but should be defined by the appended claims, and equivalents thereof. Accordingly, the aim in the appended claims is to cover all such changes and modifications as fall within the true spirit and scope of the invention.

The invention is claimed as follows:

1. A system for monitoring the frequency of a periodic function and indicating whether or not said function frequency differs from a predetermined frequency, said function frequency being represented by an electrical signal having a parameter which varies systematically in accordance with the period of said function, said system comprising:

means for generating a control signal having a characteristic which starts at a reference level and attains a predetermined level after the passage of a preselected period of time;

first switching means coupled to said control signal generating means and having two switching states, said first switching means being normally biased to one of said switching states but responsive to said control signal characteristic attaining said predetermined level for switching to the other of said switching states;

indicating means coupled to said first switching means for indicating which state said switching means is in; and second switching means coupled to said control signal generating means and responsive to said systematic variation of said parameter for periodically resetting said characteristic of said control signal to said reference level, whereby the first switching means is in one of its two switching states when the function period is less than the preselected period of time and is in the other switching state when the function period is greater than the preselected period of time, and the system thus indicates whether or not the function is occurring at the predetermined frequency.

2. A system in accordance with claim 1, in which said control signal generating means comprises a current source and a voltage storage device coupled to said current source for generating a ramp signal having an amplitude that attains said predetermined level after the passage of said preselected period of time.

3. A system in accordance with claim 2 in which said second switching means comprises a normally-open switching circuit coupled in parallel with said voltage storage device, whereby the voltage storage device is periodically shorted in response to the systematic variation of the parameter of the electrical signal.

4. A system in accordance with claim 2 which further comprises means for adjusting the current output of said current source, whereby the rate at which the amplitude of the ramp signal attains the predetermined level may be varied to thus provide for adjustment of the preselected period of time.

5. A system in accordance with claim 1 in which said indicating means comprises a lamp which is energized when said switching means is in one of said switching states and which is extinguished when said switching means is in the other of said second switching states.

6. A system in accordance with claim 1 in which said indicating means comprises an audio alarm which is deactuated when said first switching means is in said normally biased switching state and which is activated when said first switching means is in said other switching state.

7. A system in accordance with claim 1 in which said first switching means includes a set-reset flip-flop having its set terminal normally biased low and having its reset terminal connected to said control signal.

8. A system for monitoring the frequency of a periodic function of an apparatus and indicating whether or not said function frequency differs from a predetermined frequency, said function frequency being represented by an electrical signal having a frequency which varies systematically in accordance with the period of said function, said system comprising:
   first switching means coupled to said control signal generating means and having two switching states, said first switching means being normally biased to one of said switching states but responsive to said control signal amplitude attaining said predetermined level for switching to the other of said switching states;
   indicating means coupled to said first switching means for indicating which state said switching means is in;
   control signal generating means, including a current source and a voltage storage device coupled to said current source, for generating a ramp signal having an amplitude that starts at a reference level and attains a predetermined level in an amount of time which is different from that of the period of said periodic function;
   second switching means responsive to said electrical signal frequency and coupled to said control signal generating means for periodically resetting said control signal amplitude to said reference level, whereby the first switching means switches to its other state whenever the function frequency differs from the predetermined frequency.

9. A system in accordance with claim 8 in which said second switching means comprises a normally open switching circuit coupled in parallel with said voltage storage device, whereby the voltage storage device is shorted at a rate which corresponds to the frequency of the periodic function.

10. A system in accordance with claim 8 which further comprises means for adjusting the current output of said current source, whereby the rate at which the amplitude of the ramp signal attains the predetermined level may be varied to thus provide for adjustment of the preselected period of time.

11. A system in accordance with claim 8 in which said indicating means comprises a lamp which is energized when said switching means is in one of said switching states and which is extinguished when said switching means is in the other of said second switching states.

12. A system in accordance with claim 8 in which said indicating means comprises an audio alarm which is de-actuated when said first switching means is in said normally biased switching state and which is actuated when said first switching means is in said other switching state.

13. A system in accordance with claim 8 in which said first switching means includes a set-reset flip-flop having its set terminal normally biased low and having its reset terminal connected to said ramp signal.

* * * * *